United States Patent [19]

Yamada et al.

[11] Patent Number: 5,366,552
[45] Date of Patent: Nov. 22, 1994

[54] APPARATUS FOR LIQUID-PHASE EPITAXIAL GROWTH

[75] Inventors: Masato Yamada; Takao Takenaka, both of Annaka; Masahisa Endo, Gunma, all of Japan

[73] Assignee: Shin-Etsu Handotai Co., Ltd., Tokyo, Japan

[21] Appl. No.: 897,169

[22] Filed: Jun. 11, 1992

[30] Foreign Application Priority Data

Jun. 14, 1991 [JP] Japan .................. 3-170501

[51] Int. Cl.$^5$ ............... C30B 19/06; H01L 21/208
[52] U.S. Cl. ................... 118/416; 422/254; 437/125
[58] Field of Search ............ 118/400, 416; 422/245, 422/254; 437/125, 124, 130; 148/DIG. 101

[56] References Cited

U.S. PATENT DOCUMENTS 3,648,653  3/1972  Vehse .................. 118/416
3,933,539  1/1976  Gartman ............... 437/125
3,997,377  12/1976  Izawa et al. .......... 437/125

FOREIGN PATENT DOCUMENTS 63-144189  6/1988  Japan ................. 118/416

OTHER PUBLICATIONS

Doo, "Growing Epitaxial Films on a Continuous Line", IBM Technical Disclosure Bulletin, vol. 15, No. 5, Oct. 1972, pp. 1582–1583.
Patent Abstracts of Japan, vol. 6, No. 170 (E-128) (1048), Sep. 3, 1982, & JP-A-57 085 222, May 27, 1982. "Rotating Boat System for Liquid Phase Epitaxial Growth of GaP Green Light-Emitting Diodes", Yamaguchi et al., Japanese Journal of Applied Physics, vol. 15, No. 7, Jul. 1976, pp. 1219–1227.
Patent Abstracts of Japan, vol. 8, No. 236 (C-249) (1673), Oct. 30, 1984, & JP-A-59 116 190, Jul. 4, 1984.
Patent Abstracts of Japan, vol. 14, No. 14 (C-674) (3957), Jan. 12, 1990, & JP-A-1 257 187, Oct. 13, 1989.
Patent Abstracts of Japan, vol. 13, No. 233 (C-601), May 29, 1989, & JP-A-1 042 390, Feb., 1989.

Primary Examiner—Mary Wilczewski
Attorney, Agent, or Firm—Nikaido, Marmelstein Murray & Oram

[57] ABSTRACT

A method and an apparatus capable of efficiently producing an epitaxial layer grown at one time on a multiplicity of substrates with uniform thickness and quality are disclosed, in which a sealable growth chamber filled in a solution used to achieve liquid-phase epitaxial growth and holding therein at least one row of thin plate-like substrate is turned about the horizontal axis. The growth chamber is tilted or overturned so that the solution in the growth chamber is stirred homogeneously and the effect of gravity on the solution is excluded. A solution chamber for holding therein the solution is connected with the growth chamber via a gate valve. After the liquid-phase epitaxial growth, the growth chamber is overturned and then the gate valve is opened so that the solution in the growth chamber returns to the solution chamber. Thus, reuse of the solution is possible.

7 Claims, 5 Drawing Sheets

UP ← VERTICAL DIRECTION → DOWN

UP ← VERTICAL DIRECTION → DOWN

FIG. 7
CONVENTIONAL
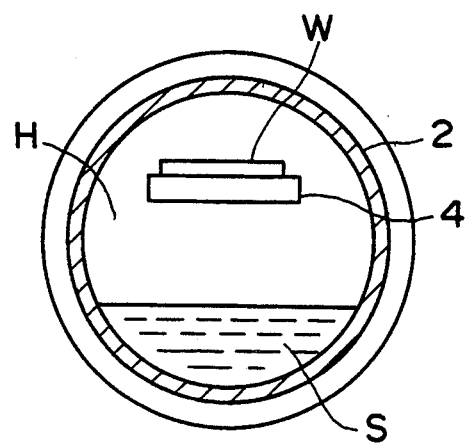
FIG. 8
CONVENTIONAL
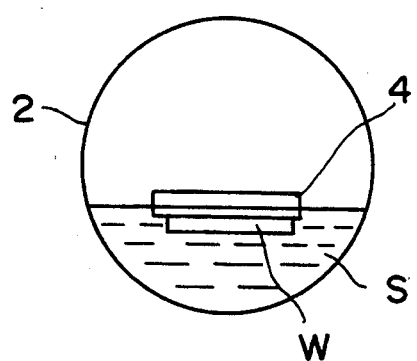

FIG. 9
CONVENTIONAL
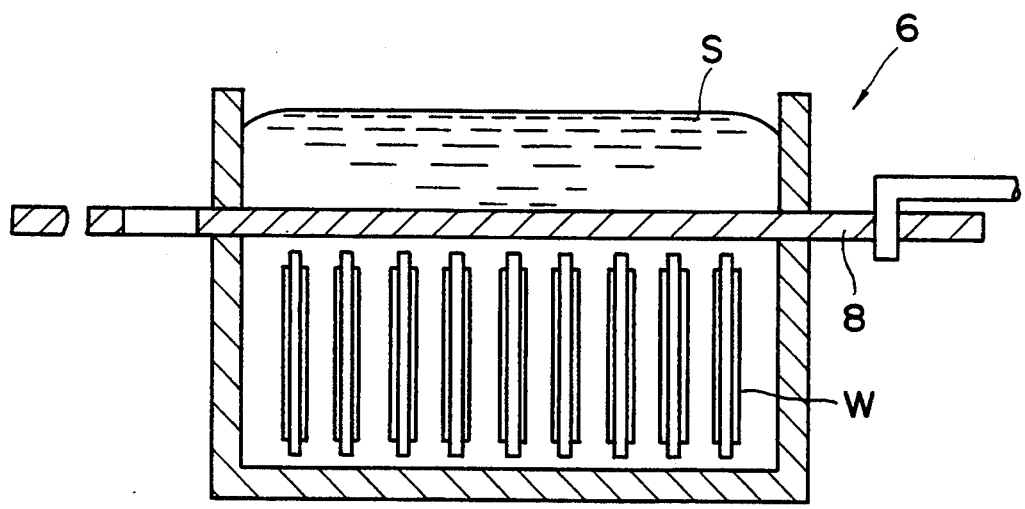
FIG. 10
CONVENTIONAL
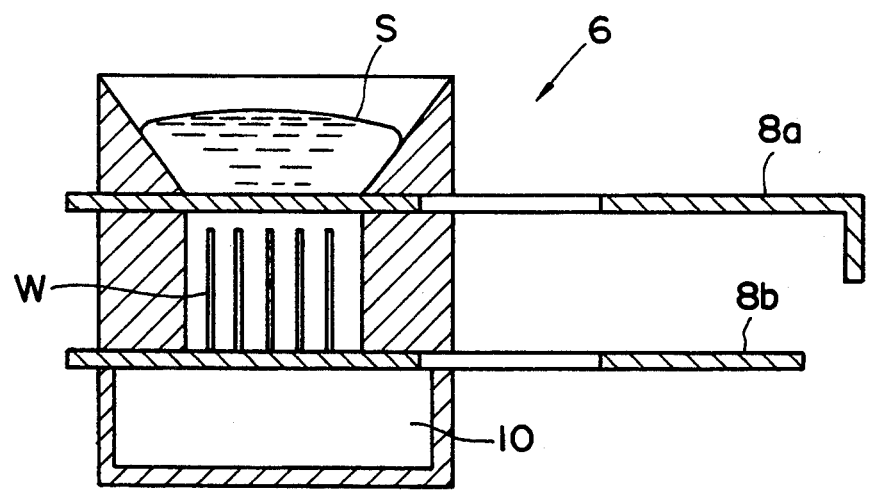

APPARATUS FOR LIQUID-PHASE EPITAXIAL GROWTH

BACKGROUND OF THE INVENTION

1. Field of the Invention

The present invention relates to a method of and an apparatus for liquid-phase epitaxial growth to obtain thin epitaxial layers grown on a plurality of thin plate-like substrates.

2. Description of the Prior Art

The liquid-phase epitaxial growth method is a process for precipitating and growing the solute in a supersaturated solution on a substrate which is brought into contact with the supersaturated solution. For industrial purposes, this method is used mainly for the production of light emitting diodes (LEDs), in which instance molten metals are used as a solvent to form a thin semiconductor layer with a desired impurity concentration on a semiconductor substrate. There are known several techniques used to carry out the liquid-phase epitaxial growth method for producing LEDs.

FIG. 7 of the accompanying drawings shows one such known technique generally known as a tipping method in which a solution S used for the liquid-phase epitaxial growth is held at a lower portion of a reaction tube 2 with a space H defined at an upper portion of the reaction tube 2. A substrate holder 4 is disposed in the space H and a semiconductor substrate W is held horizontally on an upper surface of the substrate holder 4. The reaction tube 2 is turned through an angle of 180 degrees around its axis so that an upper surface of the semiconductor substrate W is directed downward and immersed in the solution S, as shown in FIG. 8. Due to contact between the solution S and the semiconductor substrate W, a thin epitaxial layer is grown on the semiconductor substrate W. However, since the semiconductor substrate W while being in contact with the solution is held parallel to the surface of the solution, only a limited number of semiconductor substrates W can be received at one time in the reaction chamber. This method is, therefore, not suited for mass production.

FIGS. 9 and 10 show two other known methods in which substrates W are held vertically within a substrate holder 6 and a solution S falls down by gravity along the surface of the substrates W. In the method shown in FIG. 9, a horizontal partition plate 8 is pulled outward to allow the solution S to fall down along the surface of the substrates W. Upon expiration of a predetermined period of time, the solution S is removed from the substrate holder 6. The method shown in FIG. 10 is a modification of the method shown in FIG. 9 and includes an upper horizontal partition plate 8a which is moved forward to allow the solution S to fall down along outside surface of the substrates W. When a predetermined period of time is expired, a lower horizontal partition plate 8b is forced forward to allow the solution S to fall down into a solution tank 10, thereby separating the substrates W and the solution S. These known methods are able to process an increased number of substrates W at one time within the substrate holder 6. However, due to the difference in specific gravity between an upper portion and a lower portion of the solution S, the solute tends to exhaust at the lower portion of the solution S so that the thickness and impurity concentration of epitaxial growth layers vary between an upper portion and a lower portion of each individual substrate W. In addition, the solution S dropped from the substrates W cannot be used again.

SUMMARY OF THE INVENTION

With the foregoing difficulties of the prior art in view, it is an object of the present invention to provide a liquid-phase epitaxial growth method and apparatus which are capable of obtaining epitaxial layers grown efficiently at one time on a multiplicity of thin plate-like substrates, with high quality homogeneity and thickness uniformity.

According to the first aspect of this invention, there is provided a method of liquid-phase epitaxial growth, which comprises the steps of: holding at least one row of thin plate-like substrates in a sealable growth chamber; then, filling the growth chamber with a solution to be used for the liquid-phase epitaxial growth; and thereafter, while keeping the growth chamber in a sealed condition, turning the growth chamber about the horizontal axis to tilt or overturn the growth chamber for stirring the solution whereby a thin epitaxial layer is grown on each of the substrates.

It is preferable that the angle of rotation of the growth chamber is a periodic function of time elapsed, which period varies with the progress of liquid-phase epitaxial growth.

According to a second aspect of this invention, there is provided an apparatus for liquid-phase epitaxial growth, which comprises: a sealable growth chamber for receiving therein at least one row of thin plate-like substrates; a sealable solution chamber connected with the growth chamber for holding therein a solution to be used for the liquid-phase epitaxial growth; a gate valve disposed between the growth chamber and the solution chamber for selectively connecting together the growth chamber and the solution chamber and separating apart the growth chamber and the solution chamber; and drive means for rotating the growth chamber, the solution chamber and the gate valve concurrently about a horizontal axis to cause them to tilt or overturn.

The growth chamber, solution Chamber and gate valve are preferably made of a heat insulating and chemically stable material, such as a high purity carbonaceous material.

The apparatus may further include a circular cylindrical tube in which the growth chamber, solution chamber and gate valve are non-rotatably disposed. The drive means is operatively connected to the tube for rotating the same so that the growth chamber is turned about the horizontal axis into a tilted or an overturned position.

The above and other objects, features and advantages of the present invention will become more apparent from the following description when making reference to the detailed description and the accompanying drawings in which preferred structural embodiments incorporating the principle of the invention are shown by way of illustrative examples.

BRIEF DESCRIPTION OF THE DRAWINGS

FIG. 7 is a diagrammatical cross-sectional view showing a conventional liquid-phase epitaxial growth apparatus;

FIG. 8 is a view similar to FIG. 7, but showing the apparatus in its overturned position;

FIG. 9 is a schematic cross-sectional view of another conventional liquid-phase epitaxial growth apparatus; and FIG. 10 is a view similar to FIG. 9, but showing still another conventional liquid-phase epitaxial growth apparatus.

DETAILED DESCRIPTION OF THE INVENTION

The invention will be described below in greater detail with reference to certain preferred embodiments shown in FIGS. 1 through 4 of the accompanying drawings.

Figure 1:
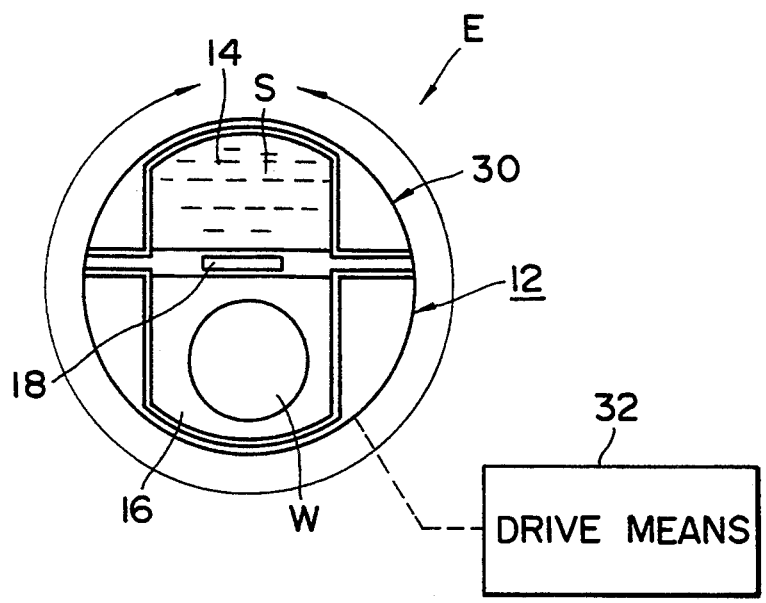
FIG. 1 is a diagrammatical view, in transverse cross section, of an apparatus for liquid-phase epitaxial growth according to an embodiment of the present invention.
Figure 2:
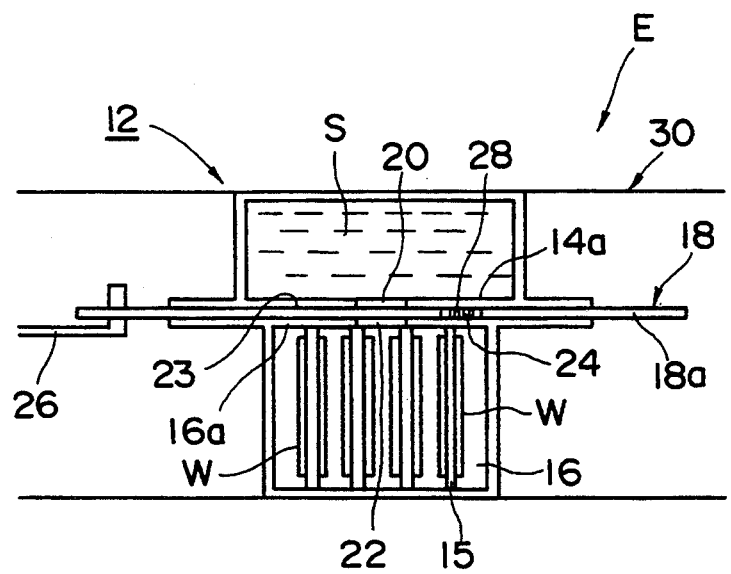
FIG. 2 is a diagrammatical view, in longitudinal cross section, of the apparatus shown in FIG. 1.
Figure 3:
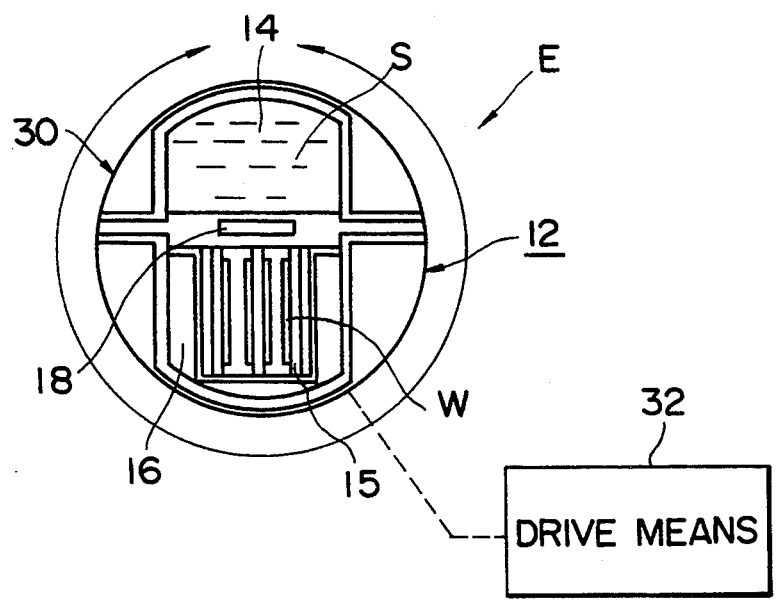
FIG. 3 is a view similar to FIG. 1, but showing an apparatus according to another embodiment of this invention.
Figure 4:
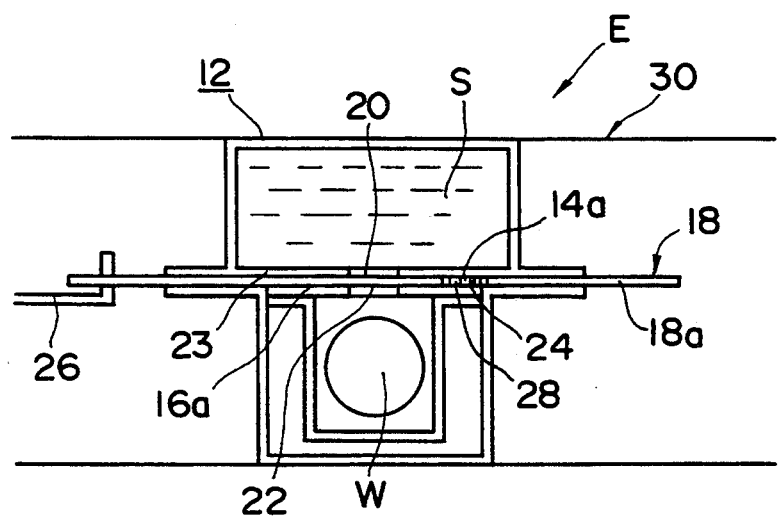
FIG. 4 is a diagrammatical view, in longitudinal cross section, of the apparatus shown in FIG. 3.

FIG. 1 diagrammatically shows the general construction of an apparatus 12 constituting a liquid-phase epitaxial growth system E according to an embodiment of this invention. The apparatus 12 includes a furnace tube 30 made of quartz, a solution chamber 14 disposed in the quartz furnace tube 30 for holding therein a solution S of the desired composition to achieve liquid-phase epitaxial growth, and a growth chamber 16 disposed in the quartz furnace tube 30 for receiving therein at least one row of substrates W supported by a support plate 15 (FIG. 2). The furnace tube 30, solution chamber 14 and growth chamber 16 are non-rotatable relative to one another but slidably movable relative to one another in a horizontal direction. The furnace tube 30 is rotatable so that the solution chamber 14 and the growth chamber 16 are rotated about a horizontal axis. The solution chamber 14 and the growth chamber 16 are normally separated by a gate valve 18 but they are able to communicate with each other upon operation of the gate valve 18. The solution chamber 14, growth chamber 16 and gate valve 18 are preferably made of a heat insulating and chemically stable material, such as a high purity carbonaceous material. An opening 24 of a valve plate 18a (FIG. 2) of the gate valve 18 is fitted with a filter 28 in the form of a drainboard. With the filter 28 thus provided, solid particles which may be formed in the solution S cannot enter the growth chamber 16.

The gate valve 18 used in the illustrated embodiment is constructed to selectively communicate and separate the solution chamber 14 and the growth chamber 16 through sliding movement between the valve plate 18a and a valve sheet formed by portions of the chambers 14 and 16. The gate valve 18 of this construction is illustrative rather than restrictive, and a valve of a different construction, such as a butterfly valve can be used. The valve plate 18a may be fixed in which instance the solution chamber 14 and the growth chamber 16 are movable relative to the fixed valve plate 18a between a closed position in which the solution chamber 14 and the growth chamber 16 are separated from one another, and an open position in which the solution chamber 14 and the growth chamber 16 communicate with each other. Furthermore, the filter 28 composed of densely pitched fine wires fitted to the opening 24 of the valve plate 18a of the gate valve 18 may be replaced with a net-like filter disposed at an outlet of the solution chamber 14 or an inlet of the growth chamber 16.

As shown in FIG. 2, the solution chamber 14 has a bottom wall 14a provided with a lower opening 20, while the growth chamber 16 has a top wall 16a provided with an upper opening 22 aligned with the lower opening 20. The bottom wall 14a and the top wall 16a are vertically separated from one another with a space defined therebetween. The valve plate 18a of the gate valve 18 is slidably disposed in the space between the bottom wall 14a and the top wall 16a. The valve plate 18a has the opening 24 which can be aligned with the lower opening 20 and the upper opening 22 in response to the movement of the valve plate 18a. The opening 24 is normally out of position with the lower and upper openings 20, 22' to separate the solution chamber 14 and the growth chamber 16. When the opening 24 is aligned with the lower and upper openings 20, 22, the solution chamber 14 communicates with the growth chamber 16 through the openings 20, 24, 22. Numeral 26 is an actuating rod connected with the valve plate 18a to reciprocate the same for opening and closing the gate valve 18.

The apparatus 12 further includes a drive means 32 operatively connected with the furnace tube 30 for rotating the furnace tube 30 to make an angular movement of the growth chamber 16 about a horizontal axis, thereby tilting or overturning the growth chamber 16. The rotation of the growth chamber 16 is performed such that the angle of rotation of the growth chamber 16 is a periodic function of time elapsed, which period may be variable with the progress of liquid-phase epitaxial growth.

With this arrangement, the solution S received in the solution chamber 14 can be filled in the growth chamber 16 through the opening 24 of the gate valve 18 and then sealed in the growth chamber 16 by the gate valve 18. It is possible to return the solution S from the growth chamber 16 to the solution chamber 14 through the opening 24 of the gate valve 18.

In order to carry out the method of this invention, the solution S is charged into the growth chamber 16 and then the growth chamber 16 is closed or sealed by the gate valve 18. Subsequently, the furnace tube 30 is turned to tilt or overturn the growth chamber 16 about the horizontal axis whereby liquid-phase epitaxial growth of a thin epitaxial layer takes place on the substrates W received in the growth chamber 16. The rotation of the growth chamber 16 may be carried out such that the angular positions of the growth chamber 16 oscillates within a predetermined angular range.

In the embodiment shown in FIGS. 1 and 2, the horizontal axis about which the growth chamber 16 tilts or overturns extends parallel to the line normal to the general plane of the substrates W. According to another embodiment shown in FIGS. 3 and 4, the horizontal axis about which the growth chamber 16 tilts or overturns extends perpendicular to the line normal to the general plane of the substrates W. In addition, the substrates W may be arranged such that the line normal to the general plane of the substrates W extends obliquely to the horizontal axis. In either arrangement, by tilting or overturning the growth chamber 16, the solution S is kept in an homogeneous condition and liquid-phase epitaxial growth is achieved uniformly without being influenced by gravity.

The liquid-phase epitaxial growth thus achieved is able to exclude the effect of gravity on the solution S and provides a constant growth rate and a uniform impurity concentration in the solution S with the result that a homogeneous epitaxial growth layer of uniform thickness is produced over the entire surface of each substrate W. After the reaction completes, the solution S is returned from the growth chamber 16 to the solution chamber 14 so that the repeated use of the solution S is possible.

More specifically, by tilting or overturning the growth chamber 16, the effect of gravity can be canceled out. Accordingly, the difference in specific gravity between the upper portion and the lower portion of the solution S is no longer materialized with the result that the distribution of solute concentration in a vertical direction is uniform, and the thickness of the epitaxial growth layer and the impurity distribution are also uniform in the vertical direction. In addition, an angular movement of the growth chamber 16 stirs the solution S and promotes replenishment of the solute exhausted in the vicinity of the growth interface, thus accelerating the growth rate. As a result, an epitaxial growth layer of uniform thickness and quality can be obtained efficiently. Furthermore, since the solution S is easy to achieve a highly homogeneous condition, it is possible to increase the solution temperature otherwise kept near the room temperature, and shorten the period of time needed for dissolving unsaturated part of the solute. It is also possible to uniformly clean or melt back the surface of the substrate W by increasing the temperature of the solution S while the growth chamber 16 is turned about the horizontal axis for stirring the solution S.

According to the apparatus 12 of this invention, the growth chamber 16, solution chamber 14 and gate valve 18 are rotatable about a horizontal axis, so that when the gate valve 18 is opened while the solution chamber 14 is disposed above the growth chamber 16, the solution S held in the solution chamber 14 is supplied into the growth chamber 16 through the opening 24 of the gate valve 18. On the other hand, when the gate valve 18 is opened with the growth chamber 16 disposed above the solution chamber 14, the solution S is returned from the growth chamber 16 to the solution chamber 14. Thus, the liquid-phase epitaxial growth can be started and stopped in a short period of time. In addition, since the growth chamber 16 is sealable by the gate valve 18, it is possible to tilt or overturn the growth chamber 16, thereby canceling out the effect of gravity on the solution S. The solute concentration, therefore, distributes uniformly in the vertical direction. Furthermore, since the solution S is stirred during angular movement of the growth chamber 16, the solute consumed in the vicinity of the growth interface is replenished smoothly and the growth rate is increased.

The invention will be further described by way of the following examples which should be construed illustrative rather than restrictive.

[Inventive Example 1]

Figure 5:
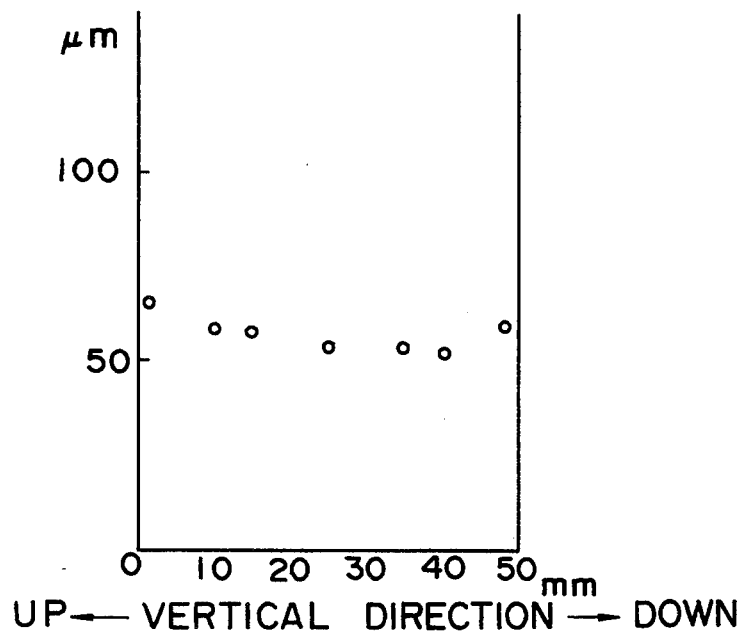
FIG. 5 is a graph showing the distribution of thickness of a growth layer obtained by the liquid-phase epitaxial growth according to this invention.

In order to obtain a p-type GaAs grown on an n-type GaAs substrate, liquid-phase epitaxial growth was carried out at a temperature from 700° to 900° C. for 200 min. by using the apparatus of this invention shown in FIGS. 1 and 2. A target thickness of the GaAs epitaxial growth layer was 100 μm. During liquid-phase epitaxial growth, the growth chamber of the apparatus was turned about a horizontal axis into a tilted position or an overturned position. After the liquid-phase epitaxial growth, the distribution of thickness of the epitaxial growth layer (in the vertical direction of the substrate) was measured. The results obtained are shown in FIG. 5. As is apparent from FIG. 5, the thickness of the epitaxial growth layer is substantially uniform throughout the measured area of the substrate. This means that the impurity concentration in a solution used in the liquid-phase epitaxial growth was substantially uniform.

[Comparative Example 1]

Figure 6:
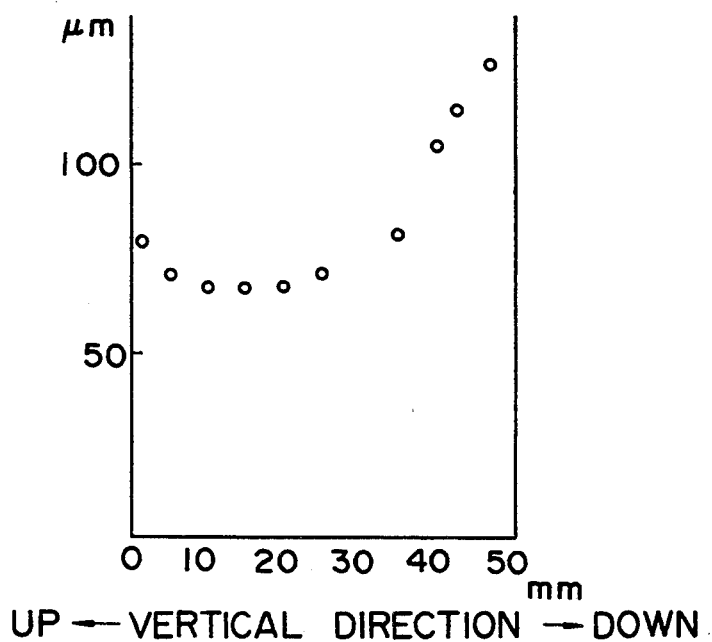
FIG. 6 is a graph showing the distribution of thickness of a growth layer obtained by a conventional liquid-phase epitaxial growth system.

For comparative purposes, liquid-phase epitaxial growth was carried out under the same condition described above with respect to the Inventive Example but by using a conventional system in which the growth chamber was not rotatable. The distribution of thickness of an epitaxial growth layer was measured in the same procedure as described above. The results thus obtained are shown in FIG. 6. As is obvious from FIG. 6, the thickness of the epitaxial growth layer is not uniform at all.

Although the Inventive Example 1 described above relates to the liquid-phase epitaxial growth of a GaAs layer, this invention is also applicable to the liquid-phase epitaxial growth of a GaP or a GaAlAs layer.

Obviously, various minor changes and modifications of the present invention are possible in the light of the above teaching. It is therefore to be understood that within the scope of the appended claims the invention may be practiced otherwise than as specifically described.

What is claimed is:

1. An apparatus for liquid-phase epitaxial growth, comprising:
    a circular cylindrical tube;
    a sealable growth chamber for receiving therein at least one row of thin plate-like substrates;
    a sealable solution chamber connected with said growth chamber for holding therein a solution to be used for the liquid-phase epitaxial growth;
    a gate valve disposed between said growth chamber and said solution chamber for selectively connecting together said growth chamber and said solution chamber and separating apart said growth chamber and said solution chamber;
    said growth chamber, said solution chamber, and said gate valve being non-rotatably disposed in said tube; and
    drive means operatively connected to said tube for rotating said tube to turn said growth chamber, said solution chamber and said gate valve concurrently about the horizontal axis to cause them to tilt or overturn.

2. An apparatus according to claim 1, wherein said growth chamber, said solution chamber and said gate valve are made from a carbonaceous material.

3. An apparatus according to claim 1, wherein said tube serves also as a furnace tube to achieve heat treatment of the substrates.

4. An apparatus according to claim 1, wherein said gate valve has an opening for the passage therethrough of said solution.

5. An apparatus according to claim 1, wherein said opening is fitted with a filter for filtering said solution.

6. An apparatus according to claim 5, wherein said filter comprises densely arrayed fine wires.

7. An apparatus according to claim 5, wherein said filter comprises a wire net.

* * * * *